United States Patent [19]

Pryor

[11] Patent Number: 4,816,876
[45] Date of Patent: Mar. 28, 1989

[54] CONTRAST CONTROL FOR LENS

[76] Inventor: Paul L. Pryor, 10 Lonsdale Ave., Dayton, Ohio 45419

[21] Appl. No.: 127,751

[22] Filed: Nov. 30, 1987

Related U.S. Application Data

[63] Continuation-in-part of Ser. No. 802,238, Nov. 27, 1985, Pat. No. 4,740,812.

[51] Int. Cl.$^4$ .............................................. G03B 27/72
[52] U.S. Cl. .................................................. 355/71
[58] Field of Search ..................... 355/67, 71

[56] References Cited

U.S. PATENT DOCUMENTS

| | | | |
|---|---|---|---|
| 2,672,799 | 3/1954 | Terwilliger | 355/71 |
| 3,040,644 | 6/1962 | Hearther | 355/71 X |
| 3,941,475 | 3/1976 | Sheets | 355/71 X |
| 4,257,086 | 3/1981 | Gulliksen | 355/71 X |
| 4,290,692 | 9/1981 | Svatek | 355/69 |

Primary Examiner—L. T. Hix
Assistant Examiner—D. Rutledge
Attorney, Agent, or Firm—Biebel, French & Nauman

[57] ABSTRACT

A device and method of controlling the amount of flare or veiling glare in an imaging system by the simple addition of light scattering element. The amount of flare or veiling glare that is produced in the optical path is variable to determines the degree of contrast loss and thus the final contrast of the image.

5 Claims, 1 Drawing Sheet

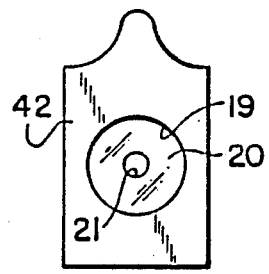
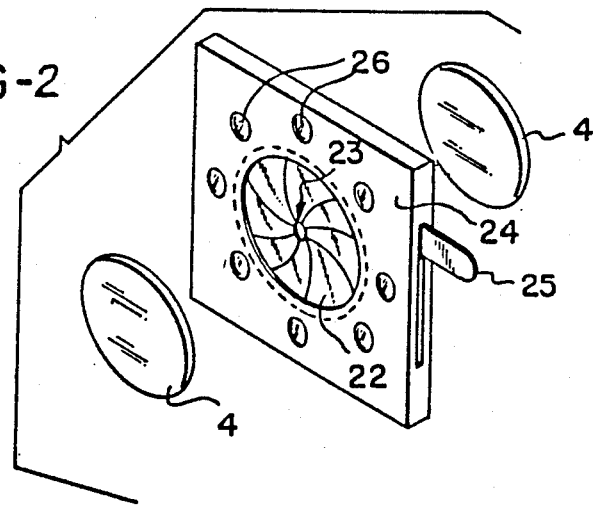

CONTRAST CONTROL FOR LENS

BACKGROUND AND OBJECTS OF THE INVENTION

This application is a continuation in part of my co-pending application Ser. No. 802,238 filed 11/27/85, now U.S. Pat. No. 4,740,812, entitled "Single Channel Masking Camera and Porjector."

This application is particularly directed to FIGS. 5 and 6 and this present invention covers an important feature of Ser. No. 802,238 which is a new means of controlling contrast in a compound lens used either as a photographic or projection lens. In Ser. No. 802,238 this contrast control device is used to modulate the contrast of a mask which in turn is used to control and enhance the contrast and appearance of a photograph. This present invention is for a lens with contrast control which can be used in other situations than controlling the contrast of a mask as in Ser. No. 802,238. Other references in this application are U.S. Pat. No. 4,422,753.

There are several ways in which an image formed by a lens can be modified and the means of modifying this image are well known. In order to separate the effect which is the subject of this invention from other effects and means for internally varying and controlling them a few effects will be discussed. In addition to geometric considerations, sharpness, or resolutions, or resolving power come to mind. This aspect of lens performance is discussed in the literature in terms of MTF, resolving power, lens aberration, point spread function, line spread function etc. Targets of various designs have been and are still being used to measure lens performance and the contrast of these targets are an important variable in the art & science of image evaluation, (see mil std. 150). In fact resolution and contrast are inter related in a basic manner best described in terms of the quantum nature of light and detective quantum effeciency.

Another important factor in over all image evaluation is the relationship of tonal values (brightness, radiance density etc.) within the image and their relationship to tonal values in the original scene or picture. Photo masking techniques (see U.S. Pat. No. 4,422,753) have long been used to modify control and correct these tonal relationships. The overall contrast as differentiated from target contrast related to resolving power, is an important aspect of this tonal rendition or control of tonal values. Photographic materials and chemical processing are all probably the most significant aspect of tonal rendition.

This invention is concerned with this over all contrast or control of tonal values, by means of adjusting the internal flare or Veiling Glare in the lens forming the image. Veiling Glare or flare is usually (practically universally) considered to be a fault or deterent to good imagery and considerable effort is expended to eliminate all lens flare or Veiling Glare by means of coating the lens elements with anti reflecting coatings, reducing the number of elements or surfaces, cementing lens elements, painting black all surfaces in or around the optic to reduce or eliminate reflections and the use of lens shades. Flare sometimes appears to the image plane in the form of a spot or streak. Light from a source other than reflections can also cause flare.

Veiling Glare if too pronounced results in a muddy, dull picture with the tonal rendition in a darker portion (shadows) most affected, low contrast pictures or picture with low contrast areas are most affected and experience has shown that in most cases lens flare, particularly when uneven is undesirable. The loss of contrast resulting from the presence of Veiling Glare results in loss of limiting resolution or resolving power. There are however, occasions when a little Veiling Glare is desirable.

Pre fogging or flashing of photo sensitive material before or after exposure is sometimes recommended. The final result is the same as a small amount of controlled Veiling Glare. Very high contrast pictures can often be improved with a little Veiling Glare. In the application of projection masking techniques as in Ser. No. 802,238 a controlled amount of Veiling Glare controls the contrast of the mask in a very desirable way.

Some enlargers and 35 mm duplicators utilize a technique for flashing the color material. This technique has the same results as introducing a controlled amount of flare and will accomplish the same result.

An object of the present invention is to provide a method of and a device for adding controlled and evenly distributed amounts of Veiling Glare or flare to an optical system.

Another object of this invention is to provide an optical system with a means of controlling image contrast by flare or Veiling Glare control.

Still another object of this invention is to provide a simple method and apparatus for controlling the contrast of photographic or projected images.

BRIEF DESCRIPTION OF THE DRAWINGS

FIG. 1 is a plan view of a device for insertion into a lens to add flare or Veiling Glare which corresponds to FIG. 5 of Ser. No. 802,238.

FIG. 2 is a plan view of an imaging lens illustrating an alternate means of flare of Veiling Glare control which corresponds to FIG. 6 of Ser. No. 802,238.

DESCRIPTION OF THE PREFERRED EMBODIMENTS

This invention relates to methods and devices for producing a lens in which flare or Veiling Glare is added in a controlled and careful manner so as to reduce the contrast of the image produced by the lens to modify the tonal rendition of said image. The simple addition of a small area of diffusing material into the path of the light rays internal to the lens will accomplish this. The preferred location for inserting this diffusing material is at or near the aperture where the rays forming any point of the image occupy all positions. Thus an object located at this point affects all points in the image equally. To further insure even distribution of the scattered light (Veiling Glare), the diffusing element can be inserted in a symetrical manner. FIG. 1 illustrates a simple device for producing a controlled amount of optical flare or Veiling Glare into an image forming compound lens. At the aperture stop of a compound lens, which may be like the lenses 4 in FIG. 2 such as where an iris diaphgram is usually situated in a photo type lens, a device like a "Water House Stop" FIG. 1 is inserted. This flare control device is an opaque insert 42 (see FIG. 1) and contains an aperture 19 corresponding in size to the maximum diameter of the lens in which it is inserted. Covering this aperture is a diffuse translucent (light scattering) material 20 with a small aperture 21 in it. This insert 42 when inserted into a lens will scatter the light through the lens in proportion to the area of light scattering diffuser 20 at the aperture. The size of the hole can be varied with different inserts and thus control the amount of scatter and thereby control the flare or Veiling glare in the optical system in a repeatable and precise matter. The material 20 may be ground glass or translucent plastic. A simpler but less sensitive and less positive method is to just insert a diffusing and optically effective element like a flat piece of ground glass into the lens, at the aperture stop. The more of the ground glass that covers the aperture the more glare or Veiling glare is introduced into the optical system.

FIG. 2 illustrates two continuously variable means for adjusting the amount of the Veiling glare or flare introduced into an optical system between the lenses 4. One method is to utilize an iris diaphragm constructed of translucent light scattering material 22, such as Mica or acrylic plastic the amount of diffusing material exposed at the aperture 23 determines the degree of scattering. No scattering is introduced into the optical system when the leaves are opened all the way and covered by aperture plate 24. The translucent iris is controlled by lever 25 or the usual type of calibrated iris control found on photographic lenses.

Instead of a translucent variable diaphragm as shown in FIG. 1 and by 22 in FIG. 2 controlled amounts of flare or Veiling glare can be introduced into an optical system by translucent apertures 26 FIG. 2. These holes 26 are located around the aperture 23 and are covered with a translucent light scattering material such as mica or acrylic plastic. These holes 26 lie within the optical path but outside the region of best optical correction. In this case control lever 25 controls sliding covers for these holes. Thus the degree of flare or Veiling glare introduced into the optical system is controlled. This method is similar to the way in which aberrations are introduced in controlled amounts to produce the well know variable soft focus lens. In this case there is no light scattering material present at the small apertures. Although in some variable soft focus lenses some flare may be introduced it is associated with aberations in a manner that produces a pleasing unsharp effect without noticably reducing the over all tonal values or contrast of the image. This present invention will control overall contrast and tonal values without producing an unsharp image. Other means of flare control will be obvious to one skilled in the art.

I claim:

1. In a compound image forming lens, a contrast controlling element comprising:
   (a) a light scattering element disposed at the aperture stop of said lens;
   (b) means for controlling the area of said light scattering element exposed at the aperture stop; and
   (c) means for repeatedly setting said controlling means at calibration marks.

2. In a compound image forming lens having at least a pair of elements, a method of controlling the contrast of the produced image comprising the steps of:
   (a) inserting a light scattering element into the lens between the elements at or near the aperture stop of said lens;
   (b) controlling the area of the said light scattering element exposed at the aperture stop; and
   (c) determining the location of the said controlling means for calibration and resetting.

3. A contrast controlling device for an imaging system having an internal optical path, comprising a light scattering element and means for inserting in a controlled manner said light scattering element into the internal optical path to add required amounts of Veiling Glare.

4. A contrast controlling device for an imaging system as set forth in claim 3 in which said light scattering element has an aperture located in the internal optical path of the imaging system.

5. A contrast controlling device for an imaging system as set forth in claim 3 in which the light scattering element is provided with an aperture and a means for varying the size of the aperture in a repeatable and controlled manner.

* * * * *